United States Patent
Song

(10) Patent No.: US 9,595,639 B2
(45) Date of Patent: Mar. 14, 2017

(54) LIGHT EMITTING DEVICE AND LIGHT EMITTING DEVICE PACKAGE

(71) Applicant: LG INNOTEK CO., LTD., Seoul (KR)

(72) Inventor: Hyun Don Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/299,583

(22) Filed: Jun. 9, 2014

(65) Prior Publication Data
US 2014/0361326 A1   Dec. 11, 2014

(30) Foreign Application Priority Data
Jun. 10, 2013   (KR) .......................... 10-2013-0065595

(51) Int. Cl.
| | |
|---|---|
| H01L 33/38 | (2010.01) |
| H01L 33/40 | (2010.01) |
| H01L 33/44 | (2010.01) |
| H01L 25/16 | (2006.01) |
| H01L 23/00 | (2006.01) |
| H01L 33/62 | (2010.01) |

(52) U.S. Cl.
CPC ............. *H01L 33/40* (2013.01); *H01L 24/14* (2013.01); *H01L 25/167* (2013.01); *H01L 33/38* (2013.01); *H01L 33/44* (2013.01); *H01L 33/62* (2013.01); *H01L 2924/12041* (2013.01); *H01L 2924/181* (2013.01)

(58) Field of Classification Search
CPC .. H01L 33/00–33/648; H01L 23/49589; H01L 23/5223; H01L 27/0288; H01L 27/0629; H01L 27/0635; H01L 27/0676; H01L 27/0682; H01L 27/0727; H01L 27/0733; H01L 27/0738; H01L 27/0805; H01L 27/0808; H01L 27/0811; H01L 27/101; H01L 27/1255; H01L 28/00–28/92; H01L 29/92–29/945
USPC ................................ 257/79–103; 438/22–47
See application file for complete search history.

(56) References Cited

U.S. PATENT DOCUMENTS

| | | | | |
|---|---|---|---|---|
| 5,977,565 | A * | 11/1999 | Ishikawa et al. | ............... 257/81 |
| 7,141,825 | B2 * | 11/2006 | Horio et al. | .................. 257/79 |
| 7,154,149 | B2 * | 12/2006 | Wu et al. | ..................... 257/355 |
| 7,166,483 | B2 * | 1/2007 | Liu | ....................... H01L 33/38 |
| | | | | 257/E33.068 |

(Continued)

FOREIGN PATENT DOCUMENTS

| | | |
|---|---|---|
| EP | 2 180 532 A2 | 4/2010 |
| KR | 10-2013-0057675 A | 6/2013 |

OTHER PUBLICATIONS

European Search Report dated Oct. 14, 2014 issued in Application No. 14 171 454.3.

*Primary Examiner* — Eric Ward
(74) *Attorney, Agent, or Firm* — Ked & Associates, LLP

(57) ABSTRACT

A light emitting device includes a light emitting structure provided over a first substrate and including at least a first conductive semiconductor layer; an active layer and a second conductive semiconductor layer. A first electrode is provided over the first conductive semiconductor layer; and a second electrode is provided over the second conductive semiconductor layer. A MIM (metal-insulator-metal) structure is provided over at least one of the first and second electrodes.

7 Claims, 5 Drawing Sheets

(56) References Cited

U.S. PATENT DOCUMENTS

| | | |
|---|---|---|
| 7,250,633 B2* | 7/2007 | Seo et al. .................. 257/82 |
| 7,326,964 B2* | 2/2008 | Lim et al. .................. 257/79 |
| 7,683,383 B2* | 3/2010 | Hong et al. ................ 257/84 |
| 7,999,282 B2* | 8/2011 | Jeong ........................ 257/99 |
| 8,575,643 B2* | 11/2013 | Watanabe et al. ......... 257/99 |
| 2006/0205170 A1 | 9/2006 | Rinne |
| 2007/0131956 A1* | 6/2007 | Lin .................... H01L 33/60 |
| | | 257/98 |
| 2007/0151755 A1 | 7/2007 | Bilenko et al. |
| 2007/0246716 A1 | 10/2007 | Bhat et al. |
| 2011/0140159 A1* | 6/2011 | Aoyagi ...................... 257/99 |
| 2011/0193191 A1* | 8/2011 | Bito ........................ 257/513 |
| 2011/0233515 A1* | 9/2011 | Hwang ...................... 257/13 |
| 2011/0297987 A1* | 12/2011 | Koizumi ............ H01L 33/44 |
| | | 257/98 |
| 2012/0146075 A1* | 6/2012 | Deguchi .................... 257/98 |
| 2012/0146077 A1 | 6/2012 | Nakatsu et al. |
| 2013/0049059 A1* | 2/2013 | Odnoblyudov et al. ... 257/99 |

* cited by examiner

LIGHT EMITTING DEVICE AND LIGHT EMITTING DEVICE PACKAGE

CROSS-REFERENCE TO RELATED APPLICATION

This application claims priority under 35 U.S.C. §119 to Korean Patent Application No. 10-2013-0065595 filed on Jun. 10, 2013, whose entire disclosure is hereby incorporated by reference.

BACKGROUND

1. Field

This disclosure relates to a light emitting device and/or a light emitting device package.

2. Background

Studies and researches on a light emitting device and a light emitting device package have been actively carried out.

The light emitting device is a semiconductor light emitting device or a semiconductor light emitting diode formed of a semiconductor material to convert electrical energy into light.

In comparison with other light sources such as a fluorescent lamp and an incandescent lamp, the LED is advantageous because of low power consumption, a long lifetime, a fast response time, safety, and environment-friendliness. Accordingly, many studies and researches to substitute the existing light sources with the light emitting diode have been performed.

In addition, light emitting devices are increasingly used as light sources of a variety of lamps used in indoor and outdoor places, a backlight unit of a liquid crystal display, a display device such as an electronic display board, and a lighting device such as a streetlamp.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

In the description of embodiments, it will be understood that when an element is referred to as being 'on (under) or under (on)' another element, it can be directly on another element or at least one intervening element may also be present. Further, when it is expressed as 'upward (downward) or downward (upward)', it may include the upward direction as well as the downward direction on the basis of one element. A body and a sub-mount disclosed in the first to seventh embodiments may be collectively referred to as a substrate, but the embodiments are not limited thereto.

Figure 1:
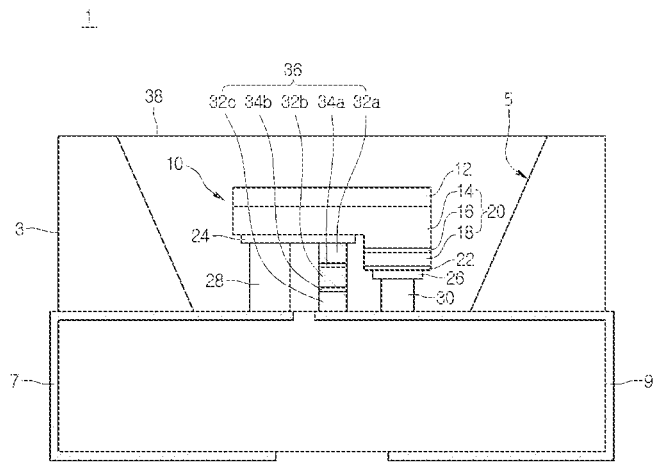
FIG. 1 is a sectional view showing a light emitting device package according to a first embodiment.

FIG. 1 is a sectional view showing a light emitting device package according to a first embodiment. Referring to FIG. 1, the light emitting device package 1 according to the first embodiment may include a body 3, first and second electrode layers 7 and 9, and a light emitting device 10.

The light emitting device package 1 according to the embodiment may further include a molding member 38 configured to surround the light emitting device 10, but the embodiment is not limited thereto. The molding member 38 may have a single-layer structure or a multiple layer structure, but the embodiment is not limited thereto. The multiple layer structure may be formed of mutually different molding materials or the same molding material, but the embodiment is not limited thereto.

The body 3 may support the light emitting device 10, and may be electrically connected with the light emitting device 10. To this end, the first and second electrode layers 7 and 9 may be formed on the body 3. Thus, the light emitting device 10 can be electrically connected to the first and second electrode layers 7 and 9.

The body 3 may include a material representing superior support strength and superior heat radiation performance, but the embodiment is not limited thereto. For example, the body 3 may include a silicon material, a synthetic resin material, a ceramic material, or a metallic material.

The body 3 may include a lower region and an upper region formed on the lower region. A cavity 5 may be formed in the upper region. The cavity 5 may be an empty space formed downward from a part of a top surface of the upper region, but the embodiment is not limited thereto. A top surface of the lower region may be partially exposed through the cavity 5.

The upper region may include an inner surface and a bottom surface defined by the cavity 5. The bottom surface may be the top surface of the lower region exposed through the cavity 5. The inner surface may have an inclined surface, which is inclined with respect to the bottom surface, but the embodiment is not limited thereto.

The first and second electrode layers 7 and 9 may be electrically insulated and spatially separated from each other. The first and second electrode layers 7 and 9 may be formed between the lower region and the upper region of the body 3, but the embodiment is not limited thereto. Each of the first and second electrode layers 7 and 9 may be formed on the top surface of the lower region of the body 3 and exposed through the cavity 5. Each of the first and second electrode layers 7 and 9 may extend from the top surface of the lower region of the body 3 to the outside of the body 3 through the space between the lower region and the upper region of the body 3. Thus, the first and second electrode layers 7 and 9 may be connected to a power supply (not shown) to receive power from the power supply. The first and second electrode layers 7 and 9 extending out of the body 3 may further extend to the lateral side and/or bottom surface of the body 3, but the embodiment is not limited thereto.

Although not shown in the drawings, the first and second electrode layers 7 and 9 may be formed by longitudinally passing through the lower region of the body, but the embodiment is not limited thereto. The first and second electrode layers 7 and 9 may be formed of a metallic material representing superior electric conductivity and corrosion resistance, such as one selected from the group consisting of Cu, Al, Cr, Pt, Ni, Ti, Au, W and an alloy including at least two of the above, but the embodiment is not limited thereto.

For example, the body 3 may be formed by injecting a material constituting the body 3 through the injection molding process and then curing the material in a state that the first and second electrode layers 7 and 9 are positioned in a mold. In this case, the first and second electrode layers 7 and 9 may be fixed to the body, but the embodiment is not limited thereto.

The light emitting device 10 may be formed in the cavity 5. In detail, the light emitting device 10 may be formed on the first and/or the second electrode layer 7 and/or 9. The light emitting device 10 may be a flip-chip type light emitting device, but the embodiment is not limited thereto.

The light emitting device 10 may be electrically connected to the first and second electrode layers 7 and 9 through a flip-chip bonding scheme. That is, the light emitting device 10 may be electrically connected to the first and second electrode layers 7 and 9 by using first and second bumps 28 and 30. The first and second bumps 28 and 30 may be formed on the light emitting device 10 or the first and second electrode layers 7 and 9, but the embodiment is not limited thereto.

Figure 2:
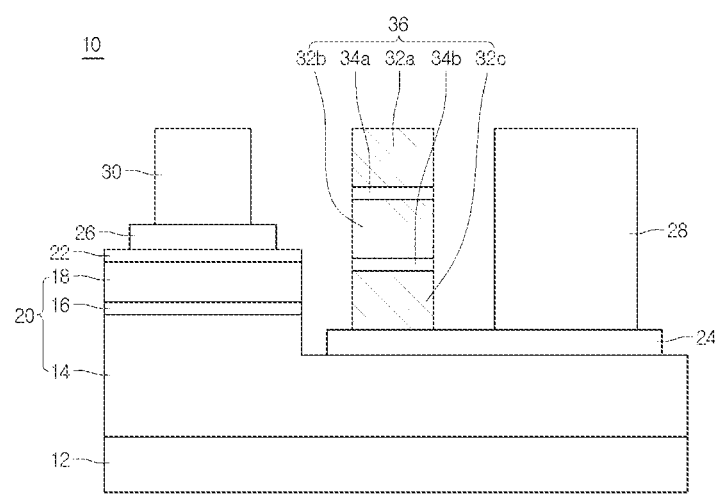
FIG. 2 is an enlarged sectional view showing the light emitting device of FIG. 1.

As shown in FIG. 2, the light emitting device 10 may include a growth substrate 12, a light emitting structure 20, first and second electrodes 24 and 26 and an MIM structure 36.

The growth substrate 12 is used to grow the light emitting structure 20 while supporting the light emitting structure 20. The growth substrate 12 may include a material suitable for the growth of the light emitting structure 20. The growth substrate 12 may include a material having a thermal stability and a lattice constant approximate to that of the light emitting structure 20. The growth substrate 12 may include one of a conductive substrate, a compound semiconductor substrate, and an insulating substrate, but the embodiment is not limited thereto.

The growth substrate 12 may include at least one selected from the group consisting of sapphire (Al2O3), SiC, Si, GaAs, GaN, ZnO, GaP, InP and Ge. The growth substrate 12 may include dopants to have conductivity, but the embodiment is not limited thereto. The growth substrate 12 including the dopants may serve as an electrode layer, but the embodiment is not limited thereto. When the growth substrate 12 is used as an electrode layer, the first electrode 24 may be omitted, but the embodiment is not limited thereto.

The light emitting device 10 may further include a buffer layer (not shown) between the growth substrate 12 and the light emitting structure 20. The buffer layer may attenuate the difference in lattice constant between the growth substrate 12 and the light emitting structure 20. In addition, the buffer layer may prevent the material constituting the growth substrate 12 from being diffused to the light emitting structure 20, prevent a melt-back phenomenon such as a recess formed in the top surface of the growth substrate 12, or controls stress to prevent crack of the light emitting structure 20 and to prevent the growth substrate 12 from being broken, but the embodiment is not limited thereto.

The light emitting structure 20 may include a plurality of compound semiconductor layers. The light emitting 20 may at least include a first conductive semiconductor layer 14, an active layer 16, and a second conductive semiconductor layer 18, but the embodiment is not limited thereto.

The buffer layer, the first conductive semiconductor layer 14, the active layer 16, and the second conductive semiconductor layer 18 may include group II-VI compound semiconductor materials or group III-V compound semiconductor materials having the composition of $Al_xIn_yGa_{(1-x-y)}N$ ($0<x<1$, $0<y<1$, and $0<x+y<1$). For example, the buffer layer, the first conductive semiconductor layer 14, the active layer 16, and the second conductive semiconductor layer 18 may include at least one selected from the group consisting of InAlGaN, GaN, AlGaN, InGaN, AlN, InN and AlInN, but the embodiment is not limited thereto.

The first conductive semiconductor layer 14 may include an N-type semiconductor layer doped with N-type dopants, and the second conductive semiconductor layer 18 may include a P-type semiconductor layer doped with P-type dopants. The N-type dopant includes at least one of Si, Ge, Sn, Se and Te, and the P-type dopant includes at least one of Mg, Zn, Ca, Sr, and Ba, but the embodiment is not limited thereto.

The first conductive semiconductor layer 14 may generate first carriers, that is, electrons, and the second conductive semiconductor layer 18 may generate second carriers, that is, holes, but the embodiment is not limited thereto.

The active layer 16 is interposed between the first and second conductive semiconductor layers 14 and 18 to emit light having a wavelength corresponding to the energy band gap, which is determined by materials constituting the active layer 16, through the recombination of electrons from the first conductive semiconductor layer 14 and holes from the second conductive semiconductor layer 18.

The active layer 16 may have one of a multi-quantum well (MQW) structure, a quantum dot structure, and a quantum wire structure. The active layer 16 may have well layers and barrier layers repeatedly formed at one cycle of a well layer and a barrier layer. The repetition cycle of a well layer and a barrier layer may be varied depending on the characteristic of the light emitting device 10, and the embodiment is not limited thereto. For example, the active layer 16 may be formed at a cycle of InGaN/GaN, a cycle of InGaN/AlGaN or a cycle of InGaN/InGaN. The bandgap of the barrier layer may be greater than that of the well layer.

The light emitting device 10 may further include a reflective electrode layer 22 above the second conductive semiconductor layer 18, that is, between the second conductive semiconductor layer 18 and the second electrode 26, but the embodiment is not limited thereto.

The reflective electrode layer 22 reflects light generated from the active layer 16 while making ohmic contact with the second conductive semiconductor layer 18, so that power can be more smoothly supplied, but the embodiment is not limited thereto. The reflective electrode layer 22 may include a reflective material representing a superior reflection characteristic. For example, the reflective electrode layer 22 may include one selected from the group consisting of Ag, Ni, Al, Rh, Pd, Ir, Ru, Mg, Zn, Pt, Au and Hf, or a multi-structure thereof, but the embodiment is not limited thereto.

Since the reflective electrode layer 22 reflects light generated from the active layer 4 and directed upward, the reflective electrode 22 may have the same size as that of the second conductive semiconductor layer 18, but the embodiment is not limited thereto. Referring to FIG. 1, the light emitting device 10 shown in FIG. 2 is turned over by 180 degrees, so the reflective electrode layer 22 may reflect the light upward as the light generated from the active layer 16 is directed downward.

The second electrode 26 may have the size at least smaller than that of the reflective electrode layer 22, but the embodiment is not limited thereto. If the reflective electrode layer 22 represents an inferior ohmic contact characteristic, a transparent electrode layer representing a superior ohmic contact characteristic may be interposed between the reflective electrode layer 22 and the second conductive semiconductor layer 18, but the embodiment is not limited thereto. The transparent electrode layer may include a transparent conductive material to transmit light. The transparent conductive material may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, but the embodiment is not limited thereto.

The first electrode 24 may be formed on a portion of the first conductive semiconductor layer 14, and the second electrode 26 may be formed on a portion of the second conductive semiconductor layer 18. For example, the first and second electrodes 24 and 26 may include one selected from the group consisting of Al, Ti, Cr, Ni, Pt, Au, W, Cu and Mo or the multi-structure thereof, but the embodiment is not limited thereto.

The first and second electrodes 24 and 26 may include a single layer or a multi-layer. The uppermost layer in the multi-layer may include a bonding pad to bond an external electrode thereto, but the embodiment is not limited thereto. When viewed from the top, the bonding pad may have a circular shape, an oval shape or a polygonal shape, but the embodiment is not limited thereto.

Although not shown, current blocking layers may be provided under the first and second electrodes 24 and 26 to prevent current from being concentrated on the lower portions of the first and second electrodes 24 and 26. The current blocking layers may be formed under the reflective electrode layer 22, but the embodiment is not limited thereto.

The size of each of the first and second electrodes 24 and 26 may be greater than the size of each current blocking layer so that the first and second electrodes 24 and 26 can supply power to the first conductive semiconductor layer 14 and the reflective electrode layer 22, respectively, but the embodiment is not limited thereto.

In addition, the first electrode 24 may be electrically connected with the first conductive semiconductor layer 14 through the current blocking layer, and the second electrode 26 may be electrically connected with the reflective electrode layer 22 through the current blocking layer. For example, the first electrode 24 may surround the current blocking layer and a bottom surface of the first electrode 24 may make contact with the first conductive semiconductor layer 14. For example, the second electrode 26 may surround the current blocking layer and a bottom surface of the second electrode 26 may make contact with the reflective electrode layer 22, but the embodiment is not limited thereto.

The light emitting device 10, that is, the flip-chip type light emitting device, may include first and second bumps 28 and 30 formed on the first and second electrodes 24 and 26, respectively. The first and second bumps 28 and 30 may have a cylindrical shape, but the embodiment is not limited thereto.

The first and second bumps 28 and 30 may be electrically connected with the first and second electrodes 24 and 26 while being physically connected with the first and second electrodes 24 and 26 through a die bonding scheme. For example, the bonding pads of the first and second electrodes 24 and 26 are melted so that the contact surfaces for the first and second bumps 28 and 30 may be formed in the bonding pads, but the embodiment is not limited thereto.

The first and second bumps 28 and 30 may include metallic materials representing superior electric conductivity, such as one selected from the group consisting of Al, Ti, Cr, Ni, Pt, Au, W, Cu, Mo, and an alloy including at least two of the above, but the embodiment is not limited thereto.

The MIM structure 36 may be formed on the first electrode 24. The first electrode 24 may include a first region and a second region. For example, the MIM structure 36 may be formed on a portion of the first region of the first electrode 24 and the first bump 28 may be formed on a portion of the second region of the first electrode 24, but the embodiment is not limited thereto. The MIM structure 36 and the first bump 28 may be physically and spatially separated from each other, but the embodiment is not limited thereto.

The MIM structure 36 may include a plurality of metal layers 32a, 32b and 32c and dielectric films 34a and 34b, which are alternately stacked. The MIM structure 36 may serve as an insulator in the operating voltage range for the light emitting device 10 and may serve as a conductor when the voltage is out of the operating voltage range, for instance, under the electrostatic discharge. To this end, the MIM structure 36 may include at least three-layer structure of a first metal layer, a dielectric film and a second metal layer, but the embodiment is not limited thereto.

Referring to FIG. 2, the MIM structure 36 may include a first metal layer 32a, a first dielectric film 34a, a second metal layer 32b, a second dielectric film 34b and a third metal layer 32c, but the embodiment is not limited thereto. For example, the first metal layer 32a may be formed on a portion of the first region of the first electrode 24, the first dielectric film 34a may be formed on the first metal layer 32a, the second metal layer 32b may be formed on the first dielectric film 34a, the second dielectric film 34b may be formed on the second metal layer 32b and the third metal layer 32c may be formed on the second dielectric film 34b.

The first metal layer 32a may be electrically connected to the first electrode 24 and the third metal layer 32c may be electrically connected to the second electrode 26, but the embodiment is not limited thereto. The number of stacks of the MIM structure 36 may vary depending on the breakdown characteristic of the dielectric material constituting the dielectric film. For example, the number of stacks of the MIM structure 36 may be reduced as the breakdown characteristic of the dielectric material is increased.

The dielectric material used for the dielectric films 34a and 34b of the MIM structure 36 may include at least one of SiO2, Si3N4, Al2O3, ZrO2 and La2O3, but the embodiment is not limited thereto. Each of the dielectric films 34a and 34b may have a thickness in the range of 3 nm to 300 nm. Each of the dielectric films 34a and 34b may have a thickness in the range of 3 nm to 150 nm. Each of the dielectric films 34a and 34b may have a thickness in the range of 3 nm to 60 nm.

The first to third metal layers 32a, 32b and 32c may include metal. For example, the first to third metal layers 32a, 32b and 32c may include one selected from the group consisting of Al, Ti, Cr, Ni, Pt, Au, W, Cu, Mo and an alloy including at least two of the above, but the embodiment is not limited thereto.

Figure 4:
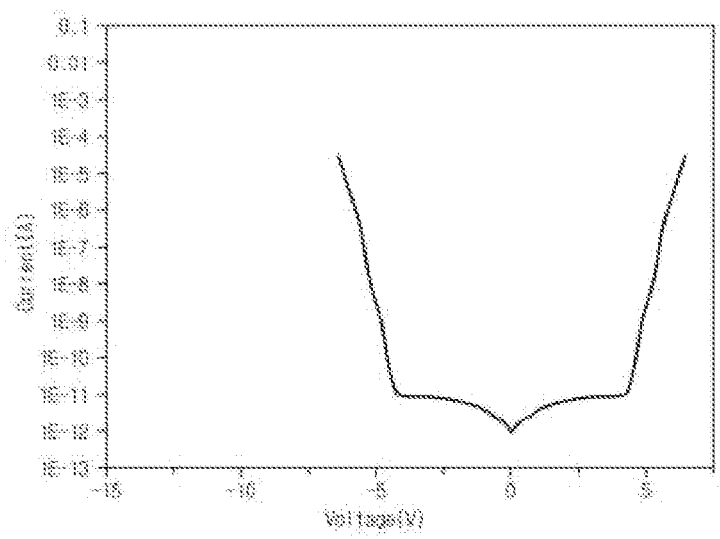
FIG. 4 is a view showing a V-I characteristic of an MIM structure of FIG. 1.

As shown in FIG. 4, the MIM structure 36 may serve as an insulator that blocks the current flow in the operating voltage range (−5 V to 5 V) and may serve as a conductor that allows the current flow when the voltage is out of the operating voltage range (−5 V to 5 V).

The uppermost layer and the lowermost layer of the MIM structure 36 may include metal layers, but the embodiment is not limited thereto.

Referring to FIG. 1, one side of the first bump 28 and the first metal layer 32*a* of the MIM structure 36 may commonly make contact with the first electrode 24. The other side of the first bump 28 may come into contact with the first electrode layer 7 and the third metal layer 32*c* of the MIM structure 36 may come into contact with the second electrode layer 9.

Figure 3:
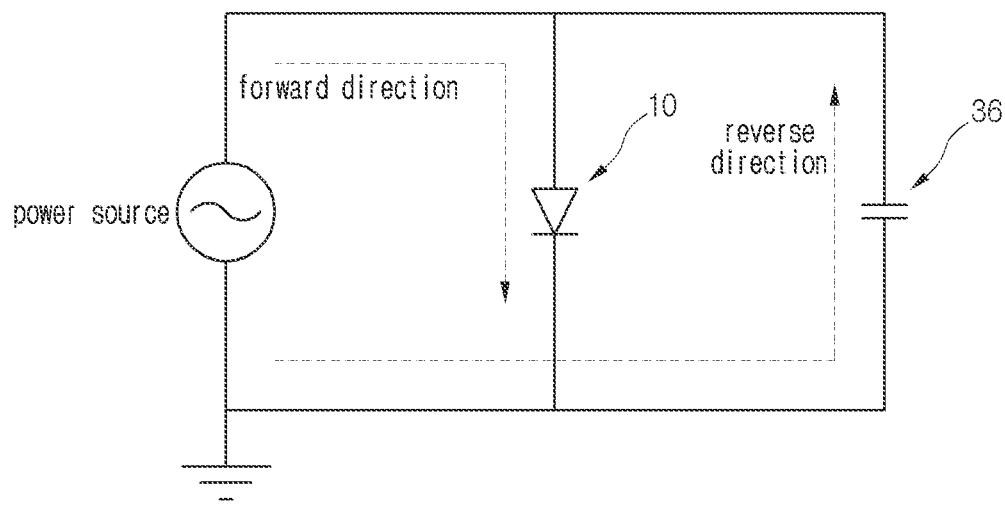
FIG. 3 is a view showing an electric equivalent circuit of the light emitting device of FIG. 1.

As shown in FIG. 3, the light emitting structure 20 and the MIM structure 36 may be connected in parallel with each other. In addition, the light emitting structure 20 may be connected to the power source.

The light emitting structure 20 is driven by the forward voltage corresponding to the driving voltage so that the light may be generated from the light emitting structure 20. If the high voltage, such as the electrostatic discharge, is applied to the first electrode layer 7 or the second electrode layer 9, the MIM structure 36 may not serve as the conductor, so the current may flow into the MIM structure 36 other than the light emitting structure 20. The MIM structure 36 may protect the light emitting structure 20 from the electrostatic discharge.

The light emitting device 10 may be prepared in the form of a module including the first and second bumps 28 and 30 and the MIM structure 36 and may be mounted on the body 3, but the embodiment is not limited thereto.

The molding member 38 may surround the light emitting device 10. The molding member 38 may be formed in the cavity 5 of the body 3. The top surface of the molding member 38 may be aligned on the same plane with the top surface of the body 3, or may be higher than or lower than the top surface of the body 3, but the embodiment is not limited thereto.

The molding member 38 may include a material representing a transmission characteristic, a heat radiation characteristic, and/or an insulating characteristic. For example, the molding member 38 may include a silicon material or an epoxy material, but the embodiment is not limited thereto. The molding member 38 may contain a phosphor to covert the wavelength of light, but the embodiment is not limited thereto.

Figure 5:
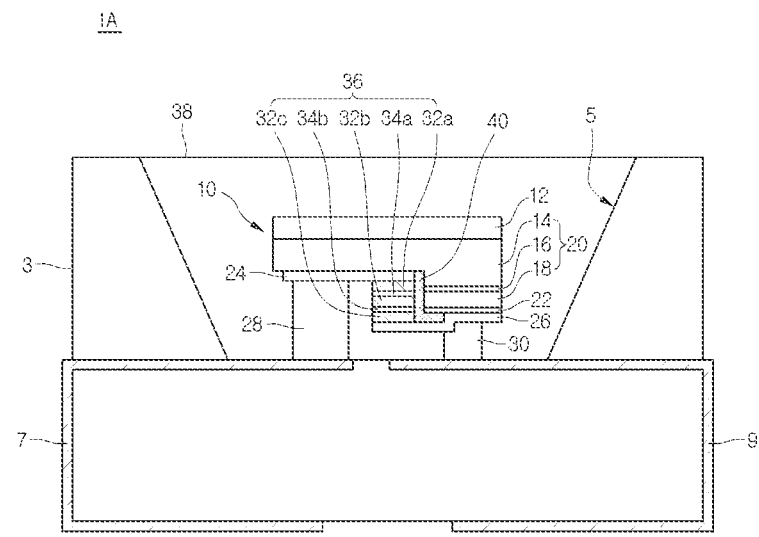
FIG. 5 is a sectional view showing a light emitting device package according to a second embodiment.

FIG. 5 is a sectional view showing a light emitting device package according to a second embodiment. The second embodiment is substantially similar to the first embodiment except that the third metal layer 32*c* of the MIM structure 36 makes contact with the second electrode 26. In the following description of the second embodiment, the same reference numerals will be assigned to the same elements having the same shape or function as those of the first embodiment and the details thereof will be omitted.

Referring to FIG. 5, the light emitting device package 1A according to the second embodiment may include a body 3, first and second electrode layers 7 and 9, a light emitting device 10 and a molding member 38. The light emitting device 10 may include a light emitting structure 20 and an MIM structure 36. The light emitting structure 20 may be formed on a growth substrate 12 and the MIM structure 36 may be formed on one side of the light emitting structure 20.

A first electrode 24 may be formed on a first conductive semiconductor layer 14 of the light emitting structure 20 and a second electrode 26 may be formed on a second conductive semiconductor layer 18 of the light emitting structure 20, but the embodiment is not limited thereto.

The MIM structure 36 may include a first metal layer 32*a*, a first dielectric film 34*a*, a second metal layer 32*b*, a second dielectric film 34*b* and a third metal layer 32*c*. The first metal layer 32*a* of the MIM structure 36 may come into contact with the first electrode 24 and the third metal layer 32*c* of the MIM structure 36 may come into contact with the second electrode 26, but the embodiment is not limited thereto.

An insulating layer 40 may be formed between the MIM structure 36 and the light emitting structure 20 in order to prevent the electric short between the first to third metal layers 32*a*, 32*b* and 32*c* of the MIM structure 36 and the light emitting structure 20, but the embodiment is not limited thereto.

The insulating layer 40 may be formed on at least a side of the first conductive semiconductor layer 14, a side of the active layer 16 and a side of the second conductive semiconductor layer 18. The insulating layer 40 may be further formed on a portion of a bottom surface of the second conductive semiconductor layer 18 or the reflective electrode layer 22, but the embodiment is not limited thereto. The insulating layer 40 may be further formed on a bottom surface of the first conductive semiconductor layer 14 between a side of the first electrode 24 and a side of the first conductive semiconductor layer 14 of the light emitting structure 20, but the embodiment is not limited thereto.

The second electrode 26 may be formed under a portion of the reflective electrode layer 22, the insulating layer 40 and the third metal layer 32*c* of the MIM structure 36. The second electrode 26 may be commonly connected to the reflective electrode layer 22 and the third metal layer 32*c* of the MIM structure 36. The second bump 30 may be formed under the second electrode 26. The first electrode 24 may be commonly connected to the first bump 28 and the first metal layer 32*a* of the MIM structure 36. The first bump 28 may be electrically connected to the first electrode layer 7 and the second bump 30 may be electrically connected to the second electrode layer 9, but the embodiment is not limited thereto.

According to the second embodiment, the MIM structure 36 may be attached to a lateral side of the insulating layer 40, so that the fixedness nature of the MIM structure 36 can be improved. According to the second embodiment, the light emitting structure 20 and the MIM structure 36 may be commonly connected to the second electrode 26, so that the structure can be simplified and stabilized.

Figure 6:
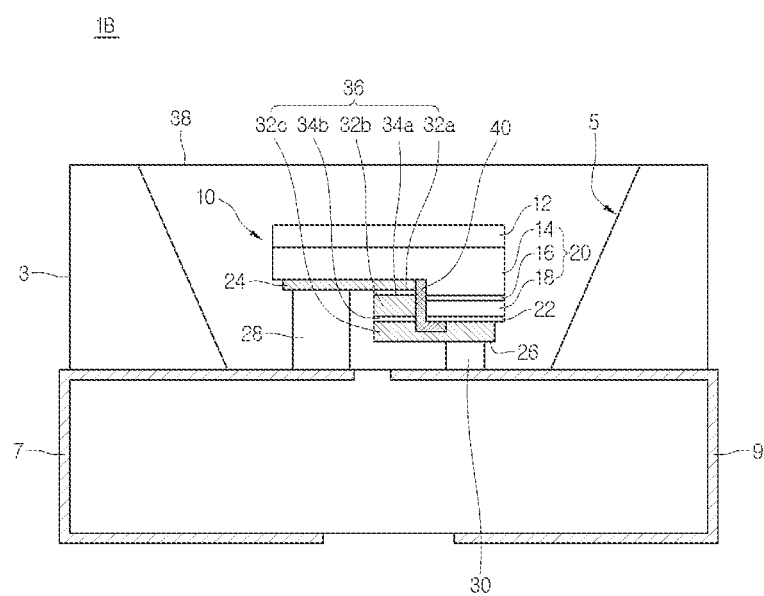
FIG. 6 is a sectional view showing a light emitting device package according to a third embodiment.

FIG. 6 is a sectional view showing a light emitting device package according to a third embodiment. The third embodiment is substantially similar to the second embodiment except that the first metal layer 32*a* of the MIM structure 36 is integrally formed with the first electrode 24 and the third metal layer 32*c* of the MIM structure 36 is integrally formed with the second electrode 26. In the following description of the third embodiment, the same reference numerals will be assigned to the same elements having the same shape or function as those of the first and second embodiments and the details thereof will be omitted.

Referring to FIG. 6, the light emitting device package 1B according to the third embodiment may include a body 3, first and second electrode layers 7 and 9, a light emitting device 10 and a molding member 38. The light emitting device 10 may include a light emitting structure 20 and an MIM structure 36. The light emitting structure 20 may be formed on a growth substrate 12 and the MIM structure 36 may be formed on one side of the light emitting structure 20.

A first electrode 24 may be formed on a first conductive semiconductor layer 14 of the light emitting structure 20 and a second electrode 26 may be formed on a second conductive semiconductor layer 18 of the light emitting structure 20, but the embodiment is not limited thereto. The MIM structure 36 may include a first metal layer 32a, a first dielectric film 34a, a second metal layer 32b, a second dielectric film 34b and a third metal layer 32c.

The first electrode 24 may be integrally formed with the first metal layer 32a of the MIM structure 36. In addition, the second electrode 26 may be integrally formed with the third metal layer 32c of the MIM structure 36.

The first electrode 24 and the first metal layer 32a of the MIM structure 36 may be formed by using the same material. The second electrode 26 and the third metal layer 32c of the MIM structure 36 may be formed by using the same material. The first electrode 24 may be formed on a first region of the first conductive semiconductor layer 14 and the first metal layer 32a of the MIM structure 36 may be formed on a second region of the first conductive semiconductor layer 14. The first metal layer 32a may extend from the first electrode 24 closely to the lateral side of the active layer 16.

The first electrode 24 and the first metal layer 32a of the MIM structure 36 may be formed of reflective metal, but the embodiment is not limited thereto. In this case, the light, which is generated from the active layer 16 of the light emitting structure 20 and reflected without being transmitted due to the growth substrate 12, may be reflected by the first electrode 24 and the first metal layer 32a of the MIM structure 36, so that the light efficiency can be improved.

The second electrode 26 may be formed on the reflective electrode layer 22 and the third metal layer 32c extends from the second electrode 26 so as to be located under the second dielectric film 34b.

According to the third embodiment, the first electrode 24 is integrally formed with the first metal layer 32a of the MIM structure 36, so that the structure can be simplified and the number of processes can be reduced, thereby reducing the manufacturing cost as compared with a case where the first electrode 24 is provided separately from the first metal layer 32a of the MIM structure 36.

According to the third embodiment, the second electrode 26 is integrally formed with the third metal layer 32c of the MIM structure 36, so that the structure can be simplified and the number of processes can be reduced, thereby reducing the manufacturing cost as compared with a case where the second electrode 26 is provided separately from the third metal layer 32c of the MIM structure 36.

Figure 7:
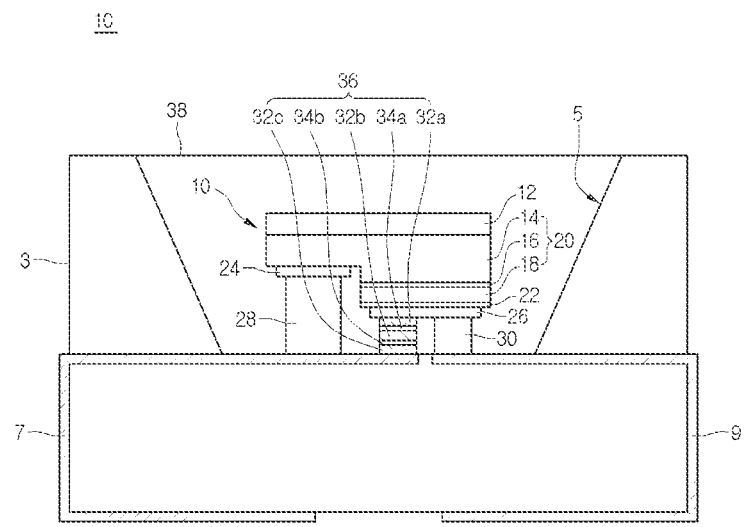
FIG. 7 is a sectional view showing a light emitting device package according to a fourth embodiment.

FIG. 7 is a sectional view showing a light emitting device package according to a fourth embodiment. The fourth embodiment is substantially similar to the first embodiment except that the MIM structure 36 is formed on the second electrode 26. In the following description of the fourth embodiment, the same reference numerals will be assigned to the same elements having the same shape or function as those of the first embodiment and the details thereof will be omitted. Referring to FIG. 7, the light emitting device package 1C according to the fourth embodiment may include a body 3, first and second electrode layers 7 and 9, a light emitting device 10 and a molding member 38.

The light emitting device 10 may include a light emitting structure 20 and an MIM structure 36. The light emitting structure 20 may be formed on a growth substrate 12 and the MIM structure 36 may be formed on one side of the light emitting structure 20. A first electrode 24 may be formed on a first conductive semiconductor layer 14 of the light emitting structure 20 and a second electrode 26 may be formed on a second conductive semiconductor layer 18 of the light emitting structure 20, but the embodiment is not limited thereto.

The MIM structure 36 may be formed on one side of the second electrode 26. A second bump 30 may be formed on the other side of the second electrode, but the embodiment is not limited thereto. The MIM structure 36 may be physically and spatially separated from the second bump 30, but the embodiment is not limited thereto.

One side of the second bump 30 may be electrically connected to the second electrode 26 and the other side of the second bump 30 may be electrically connected to the second electrode layer 9.

The MIM structure 36 may include a first metal layer 32a, a first dielectric film 34a, a second metal layer 32b, a second dielectric film 34b and a third metal layer 32c. A first side of the MIM structure 36, that is, the first metal layer 32a may come into contact with the second electrode 26 and a second side of the MIM structure 36, that is, the third metal layer 32c may come into contact with the first electrode layer 7.

One side of the first bump 28 may be electrically connected to the first electrode 24 and the other side of the first bump 28 may be electrically connected to the first electrode layer 7.

According to the fourth embodiment, when the high voltage, such as the electrostatic discharge (ESD), is applied to the first electrode layer 7 or the second electrode layer 9, the MIM structure 36 may serve as the conductor so that the current may flow through the MIM structure 36 other than the light emitting structure 20. Thus, the MIM structure 36 can protect the light emitting structure 20 from the ESD, so that the reliability of the light emitting device 10 can be improved.

Figure 8:
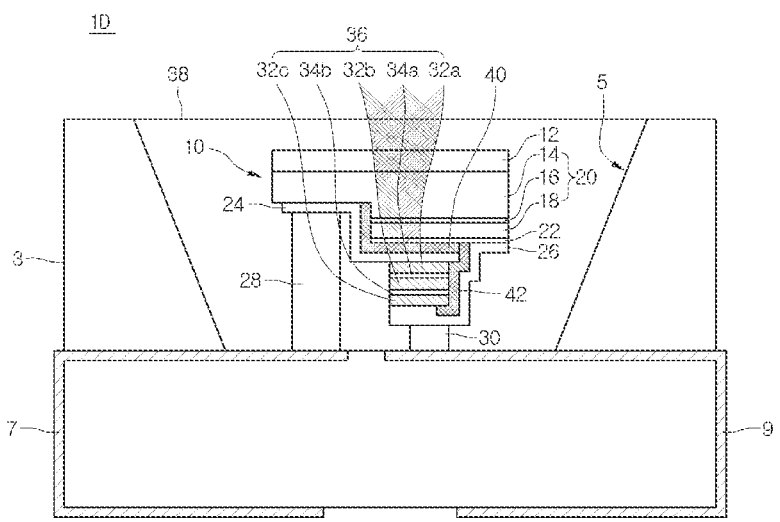
FIG. 8 is a sectional view showing a light emitting device package according to a fifth embodiment.

FIG. 8 is a sectional view showing a light emitting device package according to a fifth embodiment. Referring to FIG. 8, the light emitting device package 1D according to the fifth embodiment may include a body 3, first and second electrode layers 7 and 9, a light emitting device 10 and a molding member 38. The light emitting device 10 may include a light emitting structure 20 and an MIM structure 36. The light emitting structure 20 may be formed on a growth substrate 12 and the MIM structure 36 may be formed on one side of the light emitting structure 20.

A first electrode 24 may be formed on a first conductive semiconductor layer 14 of the light emitting structure 20 and a second electrode 26 may be formed on a second conductive semiconductor layer 18 of the light emitting structure 20, but the embodiment is not limited thereto. A reflective electrode layer 22 may be further formed between the second conductive semiconductor layer 18 and the second electrode 26, but the embodiment is not limited thereto.

The second electrode 26 may be formed on a first region of the reflective electrode layer 22 and the MIM structure 36 may be formed on a second region of the reflective electrode layer 22, but the embodiment is not limited thereto. The MIM structure 36 may include a first metal layer 32a, a first dielectric film 34a, a second metal layer 32b, a second dielectric film 34b and a third metal layer 32c. The first metal layer 32a of the MIM structure 36 may come into contact with the first electrode 24 and the third metal layer 32c of the MIM structure 36 may come into contact with the second electrode layer 26, but the embodiment is not limited thereto.

The first electrode 24 may extend onto the second region of the reflective electrode layer 22 from the first conductive semiconductor layer 14. The first metal layer 32a of the MIM structure 36 may be formed on the first electrode 24 extending onto the second region of the reflective electrode layer 22, but the embodiment is not limited thereto. The second electrode 26 may extend onto the third metal layer 32c of the MIM structure 36 from the first region of reflective electrode layer 22, but the embodiment is not limited thereto.

A first insulating layer 40 may be formed between the light emitting structure 20 and the first electrode 24. A second insulating layer 42 may be formed between the MIM structure 36 and the second electrode 26 and between the first electrode 24 and the second electrode 26.

The first insulating layer 40 may prevent the electric short between the first electrode 24 and the light emitting structure 20, for example, the active layer 16. The second insulating layer 42 may prevent the electric short between the second electrode 26 and the MIM structure 36, for example, first to third metal layers 32a, 32b and 32c.

The first insulating layer 40 may be formed on a side of the light emitting structure 20, that is, on lateral sides of the active layer 16 and the second conductive semiconductor layer 18 and a lateral side of the reflective electrode layer 22. The first insulating layer 40 may be formed on a portion of a bottom surface of the reflective electrode layer 22, that is, a region corresponding to the second region of the reflective electrode layer 22.

The second insulating layer 42 may come into contact with the first insulating layer 40 and may be formed on a lateral side of the first electrode 24, a lateral side of the MIM structure 36 and a portion of a bottom surface of the MIM structure 36. The second insulating layer 42 may be surrounded by the second electrode 26.

The first bump 28 may be formed between the first electrode 24 and the first electrode layer 7 in order to electrically connect the first electrode 24 to the first electrode layer 7. The second bump 30 may be formed between the second electrode 26 and the second electrode layer 9 in order to electrically connect the second electrode 26 to the second electrode layer 9. The second bump 30 may be formed under the second electrode 26 formed on the bottom surface of the MIM structure 36, but the embodiment is not limited thereto.

According to the fifth embodiment, the MIM structure 36 is attached to the lateral side of the first insulating layer 40 and/or onto the second insulating layer 42, so the fixedness nature of the MIM structure 36 can be improved. According to the fifth embodiment, the light emitting structure 20 and the MIM structure 36 are commonly connected to the second electrode 26, so that the structure can be simplified and stabilized.

Figure 9:
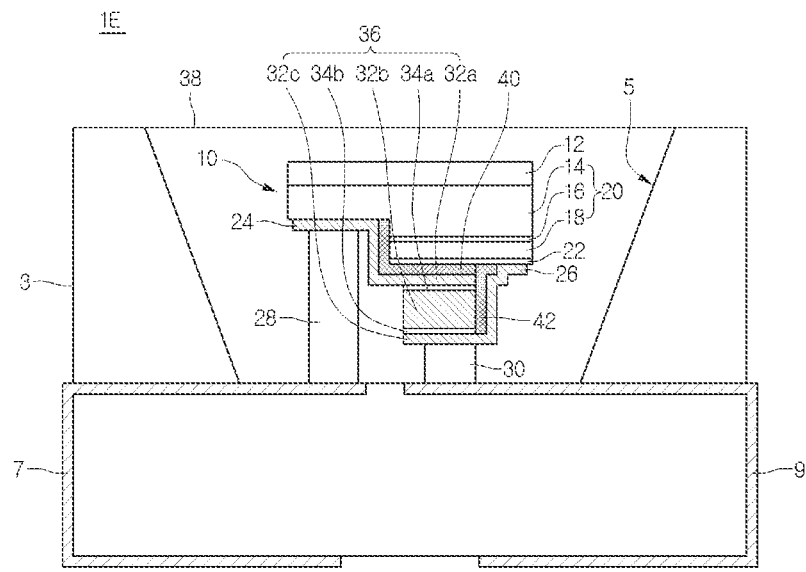
FIG. 9 is a sectional view showing a light emitting device package according to a sixth embodiment.

FIG. 9 is a sectional view showing a light emitting device package according to a sixth embodiment. The sixth embodiment is substantially similar to the fifth embodiment except that the first metal layer 32a of the MIM structure 36 is integrally formed with the first electrode 24 and the third metal layer 32c of the MIM structure 36 is integrally formed with the second electrode 26. In the following description of the sixth embodiment, the same reference numerals will be assigned to the same elements having the same shape or function as those of the fourth and fifth embodiments and the details thereof will be omitted.

Referring to FIG. 9, the light emitting device package 1E according to the sixth embodiment may include a body 3, first and second electrode layers 7 and 9, a light emitting device 10 and a molding member 38. The light emitting device 10 may include a light emitting structure 20 and an MIM structure 36. The light emitting structure 20 may be formed on a growth substrate 12 and the MIM structure 36 may be formed on one side of the light emitting structure 20.

A first electrode 24 may be formed on a first conductive semiconductor layer 14 of the light emitting structure 20 and a second electrode 26 may be formed on a second conductive semiconductor layer 18 of the light emitting structure 20, but the embodiment is not limited thereto. The MIM structure 36 may be formed on a reflective electrode layer 22. The MIM structure 36 may include a first metal layer 32a, a first dielectric film 34a, a second metal layer 32b, a second dielectric film 34b and a third metal layer 32c.

The first electrode 24 may be integrally formed with the first metal layer 32a of the MIM structure 36. In addition, the second electrode 26 may be integrally formed with the third metal layer 32c of the MIM structure 36.

The first electrode 24 and the first metal layer 32a of the MIM structure 36 may be formed by using the same material. The second electrode 26 and the third metal layer 32c of the MIM structure 36 may be formed by using the same material. The first electrode 24 may be formed on a first region of the first conductive semiconductor layer 14 and the first metal layer 32a of the MIM structure 36 may be formed on a second region of the reflective electrode layer 22. The first metal layer 32a may extend from the first electrode 24 so as to be formed on the second region of the reflective electrode layer 22.

The first electrode 24 may be formed of reflective metal, but the embodiment is not limited thereto. In this case, the light, which is generated from the active layer 16 of the light emitting structure 20 and reflected without being transmitted due to the growth substrate 12, may be reflected by the first electrode 24, so that the light efficiency can be improved. The second electrode 26 may be formed on the first region of the reflective electrode layer 22 and the third metal layer 32c extends from the second electrode 26 so as to be located on the second dielectric film 34b.

According to the sixth embodiment, the first electrode 24 is integrally formed with the first metal layer 32a of the MIM structure 36, so that the structure can be simplified and the number of processes can be reduced, thereby reducing the manufacturing cost as compared with a case where the first electrode 24 is provided separately from the first metal layer 32a of the MIM structure 36.

According to the sixth embodiment, the second electrode 26 is integrally formed with the third metal layer 32c of the MIM structure 36, so that the structure can be simplified and the number of processes can be reduced, thereby reducing the manufacturing cost as compared with a case where the second electrode 26 is provided separately from the third metal layer 32c of the MIM structure 36.

Figure 10:
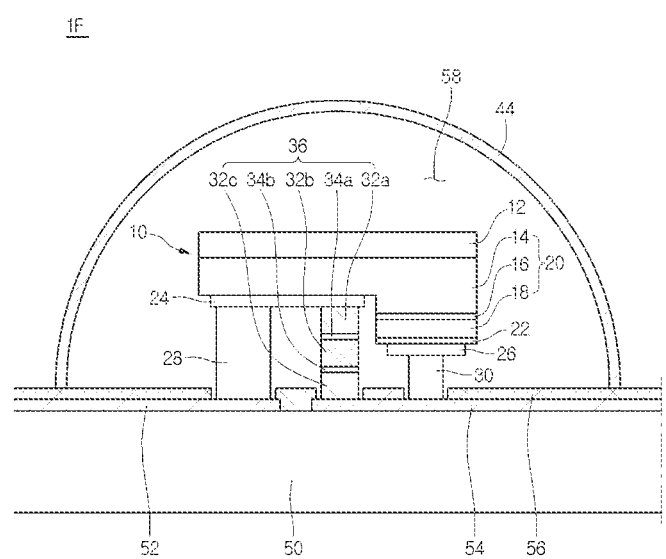
FIG. 10 is a sectional view showing a light emitting device package according to a seventh embodiment.

FIG. 10 is a sectional view showing a light emitting device package according to a seventh embodiment. Referring to FIG. 10, the light emitting device package 1F according to the seventh embodiment may include a sub-mount 50, first and second electrode layers 52 and 54, a light emitting device 10 and an optical member 44.

The sub-mount 50 may support the light emitting device 10 while being electrically connected to the light emitting device 10. For the electrical connection, the first and second electrode layers 52 and 54 may be formed on the sub-mount 50. Thus, the light emitting device 10 may be electrically connected to the first and second electrode layers 52 and 54.

The sub-mount 50 may be formed of a material having superior support strength and radiation performance, but the embodiment is not limited thereto. The sub-mount 50 may be formed of one of a plastic material, a metallic material, a resin material and a ceramic material, but the embodiment is not limited thereto. If the sub-mount 50 is formed of the metallic material, an insulating layer may be formed at least on the sub-mount 50 in order to prevent the electric short between the sub-mount 50 and the first and second electrode layers 52 and 54, but the embodiment is not limited thereto.

The first and second electrode layers 52 and 54 may be electrically connected to the light emitting device 10 to supply power to the light emitting device 10. The first and second electrode layers 52 and 54 may be formed on the sub-mount 50. The first and second electrode layers 52 and 54 may be physically and spatially separated from each other in order to avoid the electric short.

An insulating film 56 may be formed on the first and second electrode layers 52 and 54 in order to protect the first and second electrode layers 52 and 54, but the embodiment is not limited thereto.

The first and second electrode layers 52 and 54 may be surrounded by the insulating film 56 so that the first and second electrode layers 52 and 54 may not be exposed to the outside. That is, the insulating film 56 may be locally formed corresponding to the first and second electrode layers 52 and 54.

In addition, the insulating film 56 including the first and second electrode layers 52 and 54 may be formed on the entire area of the sub-mount 50.

The insulating film 56 may not come into contact with the sub-mount 50 formed between the first and second electrode layers 52 and 54, but the embodiment is not limited thereto.

In addition, in order to electrically connect the first and second electrode layers 52 and 54 to the light emitting device 10, the insulating film 56 may include a first opening corresponding to a local region of the first electrode layer 52 and a second opening corresponding to a local region of the second electrode layer 54, but the embodiment is not limited thereto.

The light emitting device 10 may be electrically connected to the first electrode layer 52 through the first opening and electrically connected to the second electrode layer 54 through the second opening.

The light emitting device 10 may include the light emitting structure 20 and the MIM structure 36. Although the light emitting structure 20 shown in FIG. 10 corresponds to the light emitting structure 20 according to the first embodiment, the seventh embodiment may include the light emitting structure 20 according to one of the second to sixth embodiments, and the embodiment is not limited thereto.

The light emitting structure 20 may be formed on a growth substrate 12 and the MIM structure 36 may be formed on one side of the light emitting structure 20.

A first electrode 24 may be formed on a first conductive semiconductor layer 14 of the light emitting structure 20 and a second electrode 26 may be formed on a second conductive semiconductor layer 18 of the light emitting structure 20, but the embodiment is not limited thereto.

The MIM structure 36 may include a first metal layer 32a, a first dielectric film 34a, a second metal layer 32b, a second dielectric film 34b and a third metal layer 32c.

The MIM structure 36 may be formed on a portion of a first region of the first electrode 24. A first bump 28 may be formed on a portion of a second region of the first electrode 24 and a second bump 30 may be formed on the second electrode 26, but the embodiment is not limited thereto.

One side of the first bump 28 may be electrically connected to the second region of the first electrode 24 and the other side of the first bump 28 may be electrically connected to a portion of the first electrode layer 52 through the first opening of the insulating film 56.

One side of the second bump 30 may be electrically connected to the second electrode 26 and the other side of the second bump 30 may be electrically connected to a portion of the second electrode layer 54 through the second opening of the insulating film 56.

The optical member 44 may surround the light emitting device 10. The optical member 44 may be spaced apart from the light emitting device, but the embodiment is not limited thereto.

The optical member 44 may adjust the travelling direction of the light emitted from the light emitting device 10 to achieve the desired brightness. In addition, the optical member 44 may extract the light emitted from the light emitting device 10 to improve the light extraction efficiency.

The optical member 44 may include transparent glass or plastic, but the embodiment is not limited thereto.

A medium layer 58 may be formed between the light emitting device 10 and the optical member 44, but the embodiment is not limited thereto.

The medium layer 58 may include air. In addition, the medium layer 58 may include a resin material, such as an epoxy material or a silicon material, which is transparent and represents superior insulating performance.

According to the seventh embodiment, the MIM structure 36 provided in the light emitting device 10 can be simply mounted on the sub-mount 50, so that the light emitting device 10 can be protected from the electrostatic discharge.

The embodiments provide a light emitting device having high reliability.

The embodiments provide a light emitting device capable of improving product yield.

The embodiments provide a light emitting device capable of preventing electrostatic discharge.

The embodiments provide a light emitting device package including such a light emitting device.

According to the embodiment, there is provided a light emitting device including a first substrate; a light emitting structure disposed on the first substrate and including at least a first conductive semiconductor layer, an active layer and a second conductive semiconductor layer; a first electrode on the first conductive semiconductor layer; a second electrode on the second conductive semiconductor layer, and an MIM (metal-insulator-metal) structure on at least one of the first and second electrodes.

According to the embodiment, there is provided a light emitting device package including a second substrate having a cavity; first and second electrode layers on the second substrate; a light emitting device in the cavity of the second substrate; a first bump disposed on the first electrode and electrically connected to the first electrode; a second bump disposed on the second electrode and electrically connected to the second electrode; and a molding member surrounding the light emitting device.

According to the embodiment, there is provided a light emitting device package including a third substrate; first and second electrode layers on the third substrate; a light emitting device on the third substrate; a first bump disposed on the first electrode and electrically connected to the first electrode; a second bump disposed on the second electrode and electrically connected to the second electrode; and an optical member surrounding the light emitting device.

According to the embodiment, the light emitting device includes the MIM structure as well as the light emitting structure, so an electrostatic protection circuit is not additionally required, so that the structure of the light emitting device can be simplified.

According to the embodiment, the light emitting device is protected by the MIM structure, so the light emitting device may have high reliability.

According to the embodiment, the MIM structure can prevent the light emitting device from being broken by electrostatic discharge, so the product yield of the light emitting device can be increased.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a light emitting structure provided under the first substrate and including a first conductive semiconductor layer, an active layer and a second conductive semiconductor layer;
   a first electrode under the first conductive semiconductor layer;
   a second electrode under the second conductive semiconductor layer;
   an MIM (metal-insulator-metal) structure under the first electrode;
   an insulating layer between the MIM structure and a side of the active layer; and
   a reflective electrode layer between the second conductive semiconductor layer and the second electrode,
   wherein the insulating layer directly contacts a portion of a bottom surface of the reflective electrode layer,
   wherein a portion of the insulating layer is disposed between the second electrode and the reflective electrode layer, and
   wherein the reflective electrode layer is in contact with an upper surface of the second electrode.

2. The light emitting device of claim 1, wherein the MIM structure comprises a first metal layer, a dielectric film and a second metal layer.

3. The light emitting device of claim 2, wherein the first and second metal layer comprises one selected from the group consisting of Al, Ti, Cr, Ni, Pt, Au, W, Cu, Mo and an alloy including at least two of Al, Ti, Cr, Ni, Pt, Au, W, Cu and Mo.

4. The light emitting device of claim 3, wherein the dielectric film has a thickness in a range of 3 nm to 300 nm.

5. The light emitting device of claim 4, wherein the dielectric film comprises at least one of $SiO_2$, $Si_3N_4$, $Al_2O_3$, $ZrO_2$ and $La_2O_3$.

6. The light emitting device of claim 1, wherein the second electrode is provided under the MIM structure.

7. The light emitting device of claim 2, wherein the first metal layer is integrally formed with the first electrode and the second metal layer is integrally formed with the second electrode.

* * * * *